United States Patent
Miyake et al.

[11] Patent Number: 5,917,144
[45] Date of Patent: Jun. 29, 1999

[54] THERMOELECTRIC GENERATOR, THERMOELECTRIC GENERATOR FOR OUTDOOR USE

[75] Inventors: Shoko Miyake, Osaka; Hisaaki Gyoten, Shijonawate, both of Japan

[73] Assignee: Matsushita Electric Industrial Co., Ltd., Osaka, Japan

[21] Appl. No.: 08/873,236

[22] Filed: Jun. 11, 1997

[30] Foreign Application Priority Data

Jun. 11, 1996 [JP] Japan ................................. 8-149239

[51] Int. Cl.$^6$ ................................................. H01L 35/30
[52] U.S. Cl. ........................................... 136/205; 136/210
[58] Field of Search ................................. 136/205, 208, 136/209, 210, 211, 212, 224, 225, 230, 242

[56] References Cited

U.S. PATENT DOCUMENTS

| | | | |
|---|---|---|---|
| 3,070,645 | 12/1962 | Tracht | 136/208 |
| 3,269,873 | 8/1966 | Dent | 136/208 |
| 3,627,588 | 12/1971 | Rubinstein et al. | 136/205 |
| 3,719,532 | 3/1973 | Falkenberg et al. | 136/208 |
| 4,520,305 | 5/1985 | Cauchy | 322/2 R |
| 4,767,467 | 8/1988 | Holland et al. | 136/217 |
| 5,427,086 | 6/1995 | Brownell | 126/110 R |

FOREIGN PATENT DOCUMENTS 4-85793  3/1992  Japan .

Primary Examiner—Kathryn Gorgos
Assistant Examiner—Thomas H. Parsons
Attorney, Agent, or Firm—Smith, Gambrell & Russell; Beveridge, DeGrandi, Weilacher & Young Intellectual Property Group

[57] ABSTRACT

A thermoelectric generator using catalytic combustion heat of fuel gas as a heat source, has a construction wherein a thermoelectric element or a planar electric generation unit comprising thermoelectric elements has a construction held between the thermal input part and the heat radiation part, having fuel gas supply means and means for mixing fuel gas with air, and having a structure such that the combustion heat can be directly supplied to the thermoelectric element by burning the mixed gas of fuel with air in a catalyst part arranged in the thermal input part, the thermal input part having a heat conductive end plate and a catalyst part which are in contact with the thermoelectric element, the face opposite to the thermoelectric element of the heat conductive end plate having a structure of convex and concave configuration, and the catalyst part being constituted in the convex and concave configuration surface.

17 Claims, 11 Drawing Sheets

FIG. 6
FIG. 7
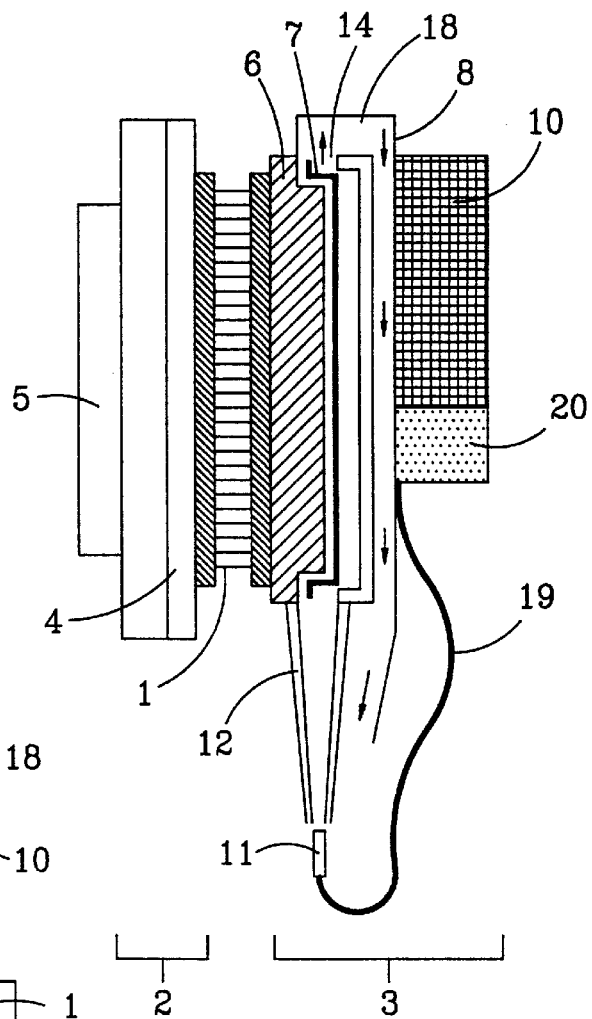
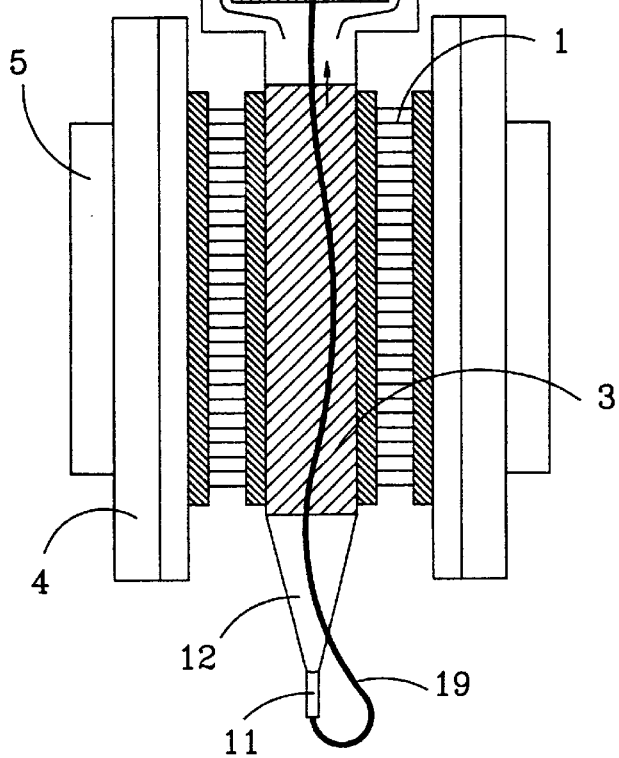

(a – a' Sectional View)

THERMOELECTRIC GENERATOR, THERMOELECTRIC GENERATOR FOR OUTDOOR USE

BACKGROUND OF THE INVENTION

1. Field of the Invention

The present invention relates to a thermoelectric generator utilizing as a heat source the heat of catalytic combustion. Also, the present invention relates to the constitution of a thermoelectric generator usable as an electric source for outdoor applications.

2. Related art of the Invention

Conventionally, as a power source for outdoor use, batteries and engine electric generators have mainly been used. However, in the case of a battery, due to the time required for charging, it is inconvenient for continuous use outdoors. The engine generators using gasoline as a fuel has a large capacity for generating electricity, but it is loud when operating and, it is not suited, for example, to be a power source for a speaker or the like, and thus its use is limited. Accordingly, as the power source for outdoor use which is safe, silent in sound, and adaptable to continuous use with good facility for use, a thermoelectric generator is recommended.

The thermoelectric generator which performs direct conversion of heat to electricity by utilizing the thermoelectric power which is produced when temperature differences provided across thermoelectric material elements has been used as an emergency power source, a portable power source, a power source for remote places, a device for recovering waste heat, etc. As the heat sources for these electric generators, there are used heat of combustion, heat of catalyst combustion, heat of exhaust gas, etc., of which the heat resulting from catalytic combustion heat has the following characteristics: the temperature adjustment can be easily made by adjustment of the flow rate of the fuel gas, and combustion heat can be thermally inputted efficiently to the electric generating part by making planar combustion.

A conventional thermoelectric generator utilizing catalytic combustion as a heat source was made public in Japanese Patent Publication (Unexamined) No. 85973/1992.

Its constitution includes, as shown in FIG. 10, a combustion chamber 22 having inside a net-like catalyst holder cylinder 21, a thermocouple 23, and a fin 24 for thermal discharge, with the high temperature side and the low temperature side of the thermocouple being fixed respectively to the outer wall of the combustion chamber 22 and the fin 24 for heat discharge.

However, the thermoelectric conversion efficiency of the generator shown in FIG. 10 which uses catalytic combustion as a heat source is generally low at 4%. Accordingly, if the performance of the thermoelectric element is unchanged, in order to improve efficiency, the generator must be configured such that the catalytic combustion occurs more efficiently. Namely, there is required a constitution to reduce the rate of the heat which is discharged without being utilized for thermoelectric conversion out of the total heat formed from catalytic combustion. In the generator shown in FIG. 10, because the exhaust gas of high temperature at about 250–600° C. is discharged from the combustion chamber, the generator involves problems of safety and convenience, especially in a case where the generator is used for civil use.

An object of the invention therefore is to provide, in consideration of the shortcomings of the conventional thermoelectric generator, a thermoelectric generator using catalytic combustion heat as a heat source, wherein efficient thermal input of catalytic combustion heat is made possible and the temperature of the exhaust gas is reduced.

Furthermore, in the case where the end use is limited to outdoor use, realization of efficient thermal input along with a more compact shape and a more practical, i.e., conveniently usable, power source has to be considered.

Accordingly, another object of the invention is to provide a thermoelectric generator using catalytic combustion heat as a heat source, wherein efficient thermal input of catalytic combustion heat is made possible, and the thermoelectric generator provides a compact and practical constitution.

Furthermore, still another object of the invention is to provide a thermoelectric generator having a compact and high performance air cooling type heat discharge system.

A thermoelectric generator in accordance with the present invention using catalytic combustion heat of a fuel gas as a heat source, has a construction wherein a thermoelectric generation unit comprising thermoelectric elements is held between the thermal input part and the heat radiation part. The invention includes fuel gas supply means and means for mixing fuel gas with air, and combustion heat can be directly supplied to the thermoelectric elements by burning the mixed gas of fuel with air in a catalyst part arranged in said thermal input part. The thermal input part has a heat conductive end plate and a catalyst part which are in contact with the thermoelectric elements. The face opposite to said thermoelectric elements of said heat conductive end plate having a convex and concave configuration, and said catalyst part being constituted in said convex and concave configuration surface.

A thermoelectric generator of the present invention using catalytic combustion heat of fuel gas as a heat source, is provided with a pair of thermoelectric generation units, comprising thermoelectric elements, held between a thermal input part and a heat radiation part, and share said thermal input part. The invention having fuel gas supply means, and means for mixing a fuel gas with air, and having a structure of being capable of directly supplying the combustion heat to said thermoelectric element by burning the mixed gas of fuel with air in a catalyst part arranged in said thermal input part. The invention further characterized in that said thermal input part comprises a heat conductive end plate and a catalyst part, a surface, opposite to said thermoelectric elements, of said heat conductive end plate has convex and concave shaped structure, and said catalyst part is constituted on said convex and concave shaped surface.

A thermoelectric generator of the present invention using catalytic combustion heat of fuel gas as a heat source, has a construction wherein a thermoelectric generation unit, comprising thermoelectric elements, is held between the thermal input part and the heat radiation part and has fuel gas supply means and means for mixing fuel gas with air. The invention having a structure such that the combustion heat can be directly supplied to the thermoelectric element by burning the mixed gas of fuel with air in a catalyst part arranged in said thermal input part. The invention is characterized by having means for thermal recovery and simultaneously reducing the temperature of exhaust gas by allowing for a heat exchange between the exhaust gas from the thermal input part and the fuel before being supplied to said thermal input part.

A thermoelectric generator of the present invention using catalytic combustion heat of fuel gas as a heat source, has a construction wherein a thermoelectric generation unit, comprising thermoelectric elements, is held between the thermal input part and the heat radiation part and has fuel gas supply means and means for mixing fuel gas with air, and has a structure such that the combustion heat can be directly supplied to the thermoelectric element by burning the mixed gas of fuel with air in a catalyst part arranged in said thermal input part. The means for mixing fuel gas with air being constituted by a nozzle for jetting a fuel gas and a throat part for sending the jetting fuel gas and air mixture into the thermal input part. The invention being provided with means for carrying out thermal recovery by allowing heat exchange between the exhaust gas from said thermal input part and the mixed gas passing in the throat part, and for reducing the temperature of the exhaust gas.

A thermoelectric generator of the present invention using catalytic combustion heat of fuel gas as a heat source, has a construction wherein a thermoelectric generation unit, comprising thermoelectric elements, is held between the thermal input part and the heat radiation part and has fuel gas supply means and means for mixing fuel gas with air. The invention has a structure that the combustion heat can be directly supplied to the thermoelectric element by burning the mixed gas of fuel with air in a catalyst part arranged in said thermal input part, said means for mixing fuel gas with air being constituted by a nozzle for jetting a fuel gas and a throat part for sending the jetted fuel gas and the air mixture into the thermal input part. The invention characterized in that the air to be mixed in the fuel gas is air which is heat exchanged by the exhaust gas from said thermal input part.

A thermoelectric generator of the present invention comprises a thermal input part using the catalytic combustion heat of a fuel gas as a heat source, a heat radiation part having a heat conductive container, at least a part of the outer surface is of a fin shape, and at least a pair of generation units held between the outer wall of said thermal input part and the inner wall of said heat radiation part. The invention further including fuel gas supply means including a fuel tank, and mixing means for mixing a fuel gas with air, said fuel gas supply means and said mixing means being installed in a heat conductive container in said heat radiation part. The invention characterized by directly supplying the combustion heat to the thermoelectric elements of said thermoelectric generation unit by burning the mixed gas of fuel with air in a catalyst part disposed in said thermal input part, and at the same time air cooling or water cooling said heat radiation part.

A thermoelectric generator of the present invention comprises a thermal input part using the catalytic combustion heat of a fuel gas as a heat source, a heat radiation part having a heat conductive container, at least a part of the outer surface is of a fin shape, and at least a pair of generation units held between the outer wall of said thermal input part and the inner wall of said heat radiation part. The invention further including a fuel tank, a fuel gas transporting means, and mixing means for mixing a fuel gas with air, said mixing means being installed in a heat conductive container in said heat radiation part, said fuel tank being freely installed in or out of the container, and connected to said mixing means through said fuel gas transporting means. The invention characterized by directly supplying the combustion heat to the thermoelectric elements by burning the mixed gas of fuel with air in a catalyst part disposed in said thermal input part, and air cooling or water cooling said heat radiation part.

A thermoelectric generator of the present invention comprises a thermal input part using the catalytic combustion heat of a fuel gas as a heat source, a heat radiation part constituted by a heat conductive plate, at least a part of the outer surface is of a fin shape, a cooling water container provided outside said heat radiation part, at least a pair of generation units held between the outer wall of said thermal input part and the inner wall of said heat radiation part. The invention further including a fuel gas supply means including a fuel tank, and mixing means for mixing a fuel gas with air, said fuel gas supply means and said mixing means being installed in a heat conductive container in said heat radiation part. The invention characterized by directly supplying the combustion heat to said thermoelectric element of said thermoelectric generation unit by burning the mixed gas of fuel with air in a catalyst part disposed in said thermal input part, and water cooling said heat radiation part by supplying water to said cooling water container.

A thermoelectric generator of the present invention comprises a thermal input part for inputting heat, a heat radiation part having a fin part and a fan, an electric generation unit held between said heat radiation part and said thermal input part for carrying out thermoelectric conversion by utilizing a thermoelectric element, and fuel supply means for supplying fuel. The invention being designed to supply heat directly to the high temperature side of said thermoelectric element, simultaneously air cool the radiation part which is in contact with the radiation side of said thermoelectric element and carry out thermoelectric generation, characterized in that the whole or a part of said fan is stored in the fin part of said radiation part.

BRIEF DESCRIPTION OF THE DRAWINGS

FIG. 6 is a block diagram of a thermoelectric generator according to the fourth embodiment of the first invention;

FIG. 7 is a block diagram of a thermoelectric generator according to a variation of the fourth embodiment of the first invention;

PREFERRED EMBODIMENTS (A)

Hereinafter, the first embodiment of the first invention will be illustrated with reference to FIGS. 1 to 9.

(Embodiment 1)

Figure 1:
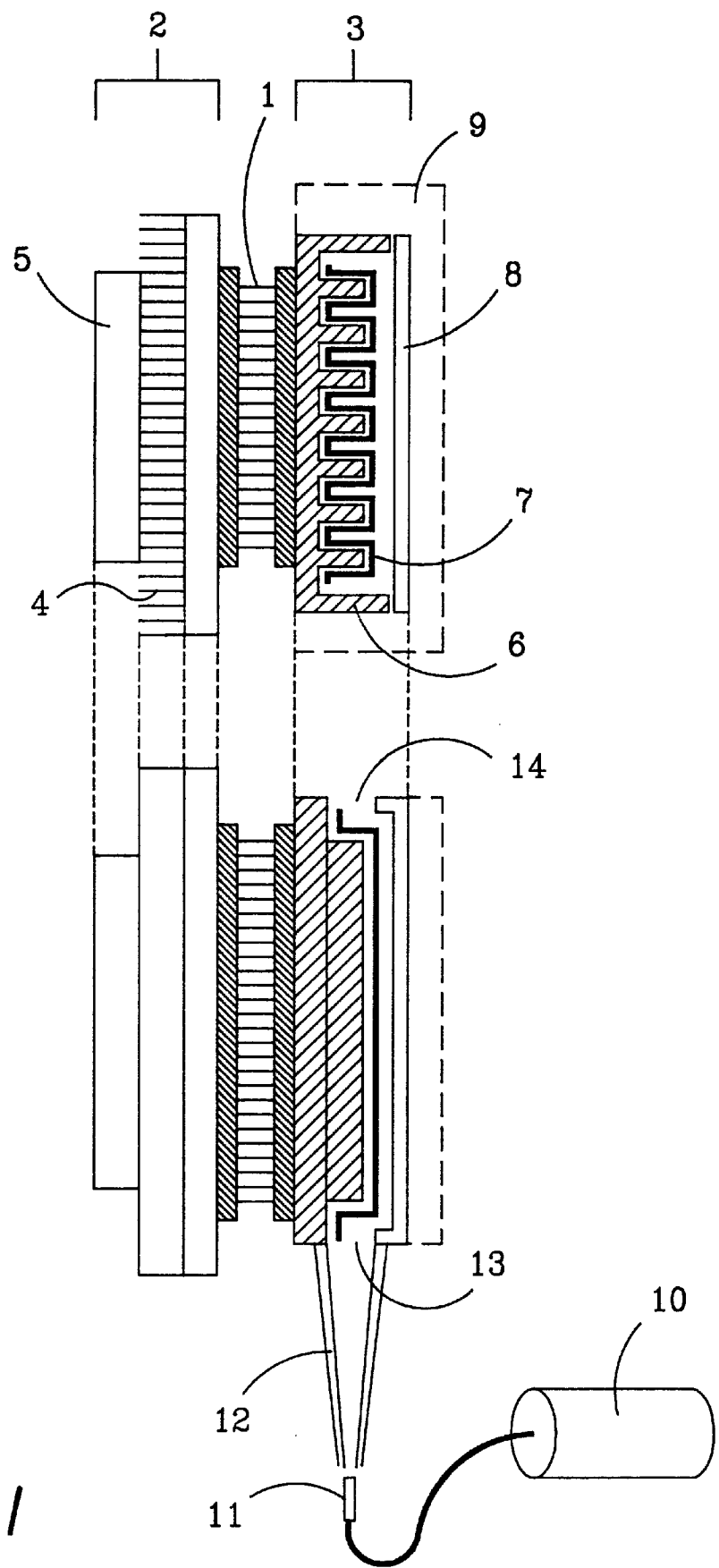
FIG. 1 is a block diagram of a thermoelectric generator according to the first embodiment of the first invention.

FIG. 1 is a sectional view showing the constitution of the thermoelectric generator according to Embodiment 1, wherein the upper drawing is a cross-sectional view, and the lower drawing is a vertical sectional view. In FIG. 1, the part 1 is a thermoelectric generating unit made by connecting in series a plurality of thermoelectric elements, being held between the radiating part 2 and the thermal input part 3. The radiation part 2 is constituted by an aluminum fin 4 for radiation and a fan 5. The heat input part 3 comprises a heat conductive end plate 6 and a catalytic part 7. The heat conductive end plate 6 has a configuration of comb shaped heat exchange fin so that the face opposite to the face joining with the thermoelectric element 1 has increased surface area. Accordingly, for the heat conductive end plate 6 it is desirable to use an aluminum die cast which has good processability. The catalyst part 7 is installed in a manner to cover the surface of the heat conductive end plate 6 on the comb shaped heat exchange fin side. The part 8 is a side wall, and 9 is a heat insulating material such as alumina wool. The part 10 is a fuel tank for holding fuel, such as butane, and is connected to the thermal input part 3 through the nozzle 11 and the throat part 12 which comprise the mixing means for mixing fuel gas with air. Of the thermal input part 3, the part 13 is a gas flow inlet, and 14 is an exhaust port.

With respect to the thermoelectric generator constituted as above, the operation thereof is explained below. The fuel ejected from the nozzle 11 becomes a mixed gas involving the surrounding air, and passes through the throat part 12 to be sent into the thermal input part 3 from the gas flow inlet 13. The charged mixed gas experiences catalytic combustion on the catalyst part 7 in the thermal input part 3, after which it is discharged outside the generator from the exhaust port 14. The catalytic combustion heat obtained in the thermal input part 3 reaches the high temperature side surface of the thermoelectric element 1 through the heat conductive end plate 6. As the low temperature side of the generating unit 1 is in contact with the radiation part 2, there occurs temperature difference between the high temperature side and the low temperature side of the generating unit 1 and electric generation is performed by thermoelectric power.

According to this embodiment, by using a heat conductive end plate having a comb shaped structure, a thermal input part of a type integral with the heat exchanger can be constituted, and accordingly, the catalytic combustion heat can be efficiently inputted to the high temperature side surface of the generating unit. Also, as the heat conductive end plate and the catalyst part are in mutual contact, excessive rise of the surface temperature of the combustion part can be prevented to make it possible to realize a constitution suited for the heat resistance of the thermoelectric element.

When the thermal input part is formed into such constitution as to surround the catalyst part which is formed on the surface side of the comb shaped fin input of each heat conductive end plate, the surface areas of the catalyst part and the fin can be doubled without changing the volume of the thermal input part. Therefore, it is possible to constitute a thermal input part of higher density.

Embodiment 2

Figure 2:
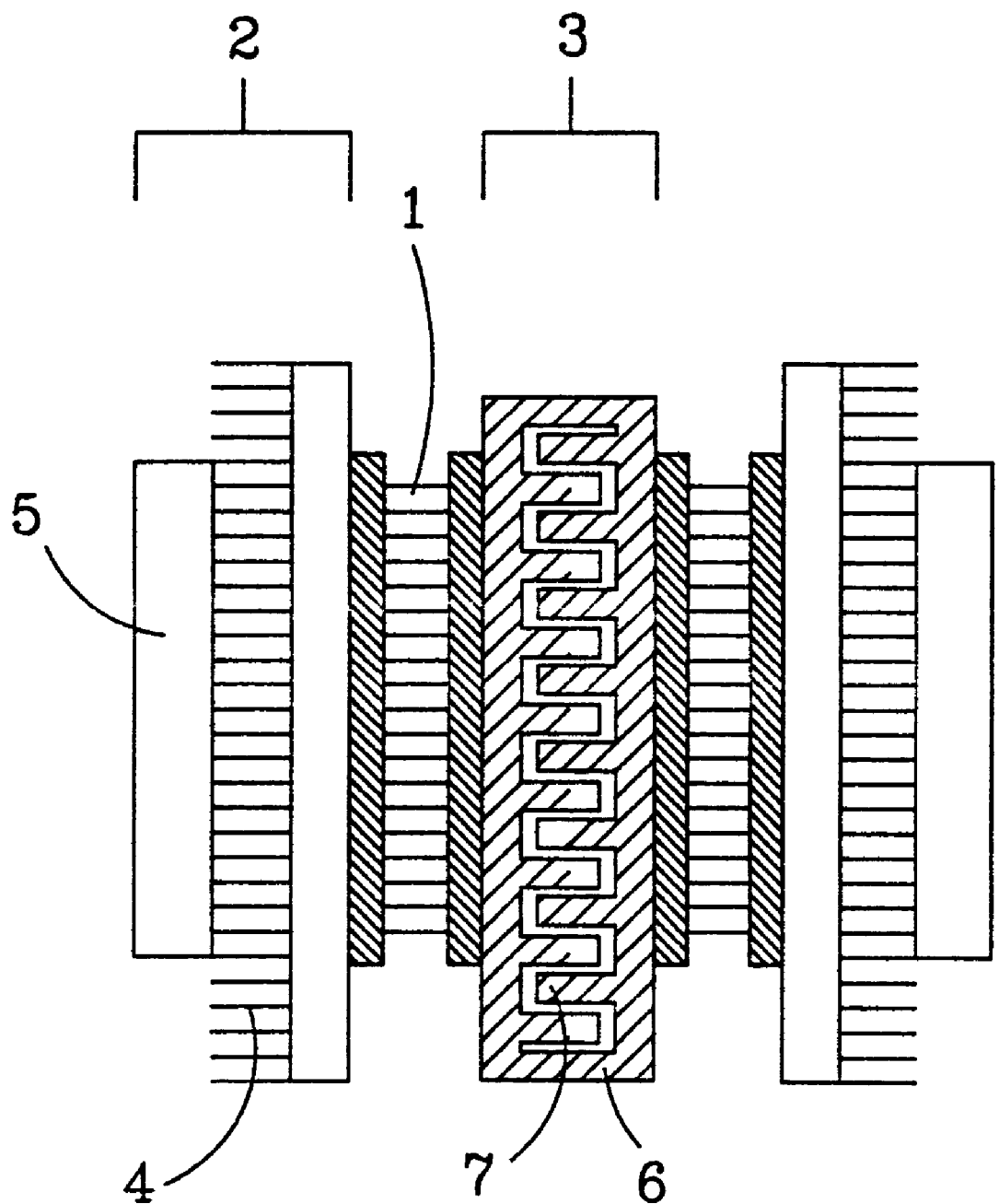
FIG. 2 is a block diagram of a thermoelectric generator according to the second embodiment of the first invention.

In FIG. 2, there is shown a constitution of a thermoelectric generator wherein a pair of thermoelectric generator units, comprising thermoelectric elements, are bonded to both sides of the thermal input part, and located between the thermal input part and the radiation part.

In FIG. 2, the construction of the heat conductive end plate 6 of the thermal input part 3 is the same as that of Embodiment 1, but in the style of the present embodiment a pair of heat conductive end plates 6 are combined in a manner that the comb shaped fin side surfaces of a pair of heat conductive end plates 6 are opposed, and the catalyst part 7 is formed on each comb shaped fin. On the surface opposite to the comb shaped fin side of each heat conductive end plate 6 there is set up a generation unit 1 comprising a plurality of thermoelectric elements. As a generation unit 1, there is used one having a construction wherein a plurality of thermoelectric elements arranged on a plane are connected in series. The construction of the radiation part 2 is similar to that of Embodiment 1, wherein the radiation part 2 is installed in a manner to hold these planar generating units 1 with the thermal input part 3. Since the operation of the generator of this constitution is the same as that of Embodiment 1, description thereof is omitted.

As shown in FIG. 2, by arranging the combustion chamber which is a thermal input part 3 into such construction as to have the heat conductive end plates positioned in an opposite manner, the surface area of the heat exchange fins can be increased simultaneously with the increase in the catalytic combustion area, with the volume of the combustion chamber left unchanged. Thus, a higher density heat source can be formed. Furthermore, by making the generation unit an opposed type by installing the generation units on both sides of the thermal input part, combustion heat discharged outside the generator from the surface of the thermal input part can be largely decreased, thereby permitting the thermal input in good efficiency. As a result, it becomes possible to constitute a compact thermoelectric generator with greatly improved generation efficiency.

Embodiment 3

Figure 3:
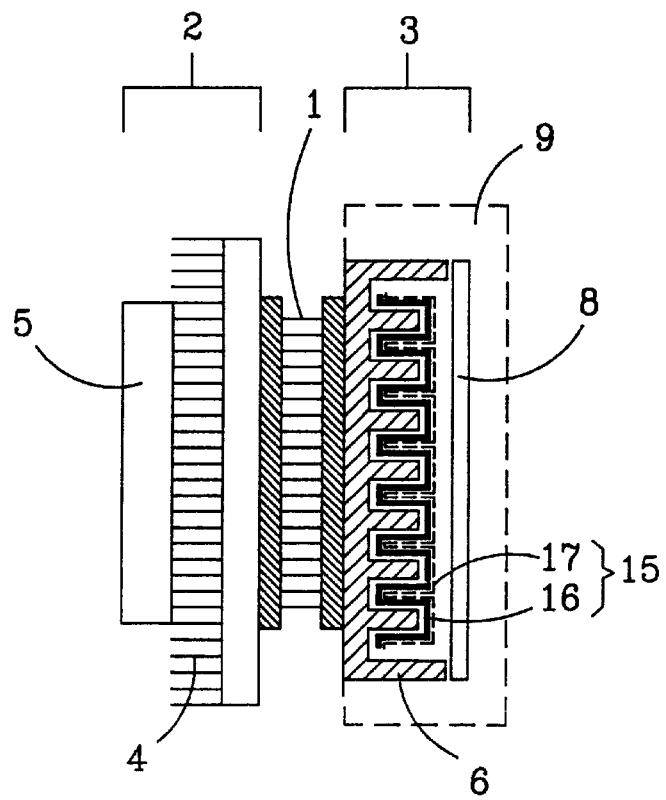
FIG. 3 is a block diagram of a thermoelectric generator according to the third embodiment of the first invention.

FIG. 3 is a block diagram of a thermoelectric generator in the case of using a metal carried catalyst 15 as a catalyst part. The catalyst part 15 has a construction wherein ceramic fine powder 17 such as alumina carrying a precious metal catalyst of platinum or the like is applied to the surface of a heat-resistant metal thin plate 16 having a thickness of no more than 0.5 mm. For the heat resistant metal thin plate 16 a material having good processing property such as SUS plate may be used. Other constitution and operation are the same as those of Embodiment 1.

By using the catalyst part 15 of the constitution as in FIG. 3, a high performance catalyst part can be produced at a low cost. Furthermore, in case of the degradation the catalyst part can be simply replaced to improve practical utility.

Between the heat resistant metal thin plate 16 and the fin part 6b of the end plate 6, a gap is provided. By this gap there can be obtained an effect of the catalyst temperature not to be excessively lowered and good heat conductivity.

Figure 4:
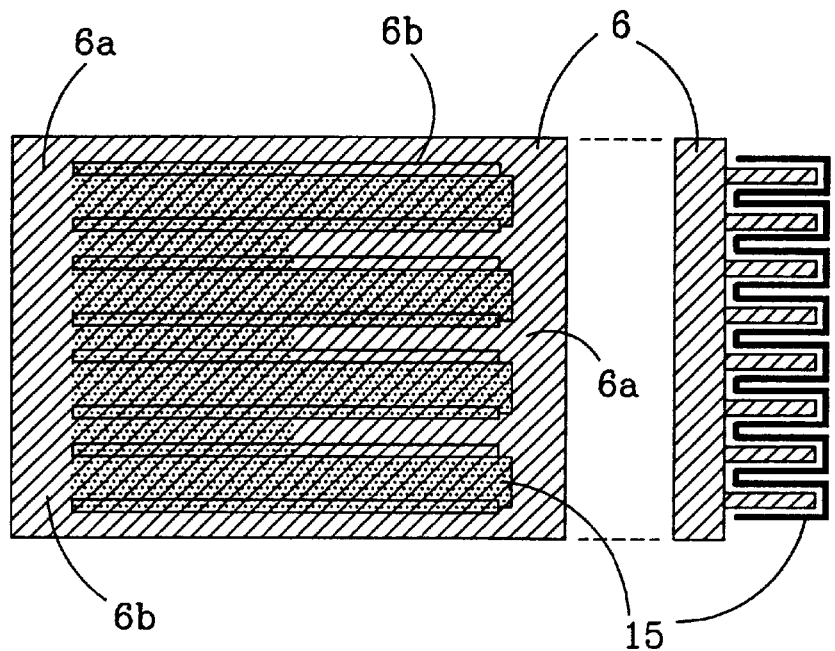
FIG. 4 is a block diagram of a catalyst part in the thermoelectric generator according to the third embodiment of the first invention.

An example where a metal carrier catalyst having a rectangular wave shape at the end of the gas flow inlet side is used as a metal carrier catalyst 15 is shown in FIG. 4. In FIG. 4, the right side figure is a cross-sectional view, and the left side figure is a vertical section taken from the right side thereof. A gas flows in from the right side of the left figure (the right side here practically corresponds to the lower part). A metal carrier catalyst 15 is formed on a part of the fin side surface of the heat conductive end plate 6. That is to say, in the left side figure, on the base plate part 6a of the end plate 6, there are provided in projection eight fins 6b of the end plate 6 in lateral direction. And, on the uppermost fin part 6b the catalyst is formed only to about ⅔ part to the left, on the directly lower fin part 6b the catalyst 15 is wholly formed, and on the next lower fin part 6b the catalyst 15 is formed only to about ⅔ part to the left. The succeeding fin parts 6b are of the similar state. On the other hand, as to the end plate base plate 6a between those fins 6b there exist alternately the portions covered wholly with the catalyst 15 and the portions covered only to about ⅔ to the left part.

According to the constitution of the catalyst part 15 as in FIG. 4, because the catalyst part 15 on the gas inlet side becomes less, the catalyst combustion on the inflow side which tends to become high temperature can be dispersed, so that the heat can be conducted without unevenness to the high temperature side surface of the thermoelectric element through the heat conductive end plate. Accordingly, the difference of thermoelectric powers between the thermoelectric material chips constituting the thermoelectric elements can be dissolved, and the damage or deterioration of the elements caused by the local excess of the heat resistant temperature of the element can be prevented, with the result that the efficiency and durability of the generator can be improved.

As to the shapes of the catalyst part end, there may be corrugated, V-shaped, etc. in addition to the rectangular shape as illustrated in the left view of FIG. 4.

Figure 5:
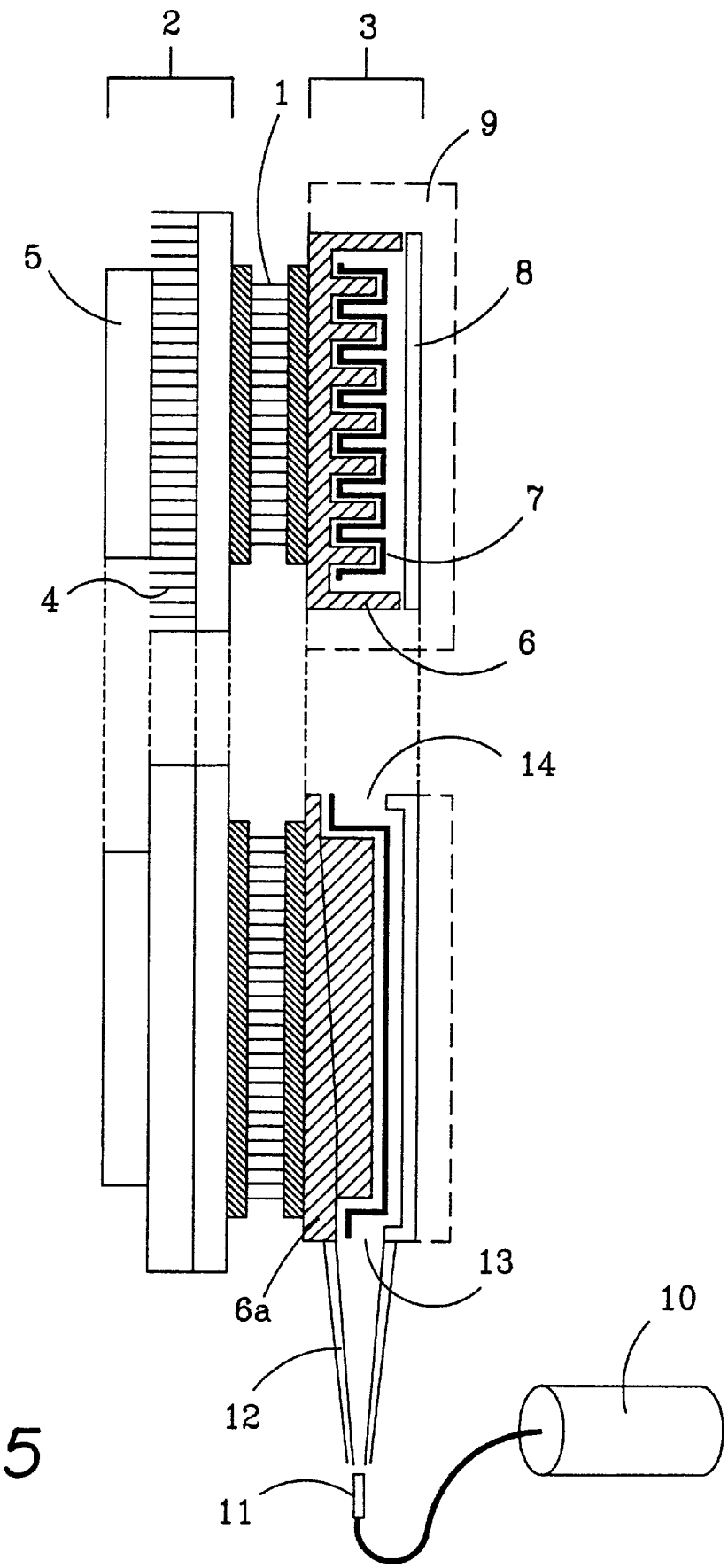
FIG. 5 is a block diagram of a thermoelectric generator according to the third embodiment of the first invention.

Further, FIG. 5 is a sectional view of a thermoelectric generator in the case thickness of the heat conductive end plate 6 is changed from being larger in the vicinity of the gas flow inlet 13 to being smaller in the vicinity of the exhaust port 14. The upper view is a cross-section while the lower view is a vertical section.

In the constitution of the apparatus of FIG. 1, the catalytic combustion heat is formed in a higher concentration in the vicinity of the end of the catalyst part 7 on the gas flow inlet 13 side, and as a result a temperature distribution is formed on the heat conductive end plate 6 in the gas flow direction. However, by using a heat conductive end plate 6 constituted as shown in FIG. 5, the temperature distribution in the thermal input surface does not occur and heat can be conducted to the high temperature side surface of the thermoelectric element in an even manner. In other words, the thickness of the base part 6a of the end plate 6 is thicker on the inflow side and thinner on the outflow side.

Because of the above, a difference of thermoelectric powers between the thermoelectric elements constituting the thermoelectric element generating unit can be dissolved, leading to an improvement in electric generation efficiency. Also, it is possible to prevent damage or deterioration of the element caused by local excess of the heat resistant temperature of the element, and the durability of the generator can be improved.

Furthermore, though not illustrated, when the catalyst part 15 is reduced to half area, namely, when, as has been illustrated in FIG. 4, the catalyst part on the inflow side 15 is made not to cover either the base part 6a of the end plate 6 or the fin part 6b, the position on which concentrated catalytic combustion occurs comes to nearly the central part of the joint face with the thermoelectric element electric generation unit. In forming the catalyst part 15 in such a manner, the thickness of the base plate 6a of the heat conductive end plate 6 may be set so as to become largest in the neighborhood of the position of catalytic combustion near the center and become smaller toward both ends of the end plate 6.

Embodiment 4

FIG. 6 is a sectional view showing the constitution of the thermoelectric generator according to Embodiment 4. In FIG. 6, a planar electric generating unit 1, made by connecting in series a thermoelectric element or a plurality of thermoelectric elements, is held between the heat radiation part 2 and the heat input part 3 in the same manner as in Embodiment 1. On the outer surface of the side wall 8 of the thermal input part 3 there is constituted an exhaust gas flow path 18, and further outside a fuel tank 10, an evaporation chamber 20, a flow path 19, a fuel gas jetting nozzle 11, and a throat part 12 are located in communication with the inside of the thermal input part 3. For the side wall 8 of the thermal input part 3 of this constitution, use of material having good heat conductivity, such as aluminum, is preferable.

With respect to the thermoelectric generator constituted as above, the operation thereof is described. The fuel ejected from the nozzle 11 becomes a mixed gas involving the circumferential air, passes through the throat part 12, and is sent into the thermal input part. The heat obtained on catalytic combustion of the entering mixed gas on the catalyst 7 in the thermal input part is utilized for electric generation by the thermoelectric elements 1 in the same manner as in Embodiment 1. On the other hand, the exhaust gas produced by catalytic combustion passes through the exhaust gas flow path 18 from the exhaust port 14, and, coming into contact with the outer surface of the side wall 8 of the thermal input part 3 in the exhaust gas flow path 18, a fuel gas tank 10, an evaporation chamber 20, a flow path 19, and a throat part 12. The exhaust gas is discharged outside the generator while carrying out heat exchange.

According to this embodiment, by making heat exchange between the exhaust gas from the thermal input part 3 and the fuel gas in the tank 10, flow path 18, evaporation chamber 20, and throat part 12, a part of the discharged catalyst combustion heat can be recovered to bring the mixed gas to a higher temperature before combustion. Because of this, the calorific power to the amount of gas used increases and the efficiency of thermoelectric generator can be improved. Moreover, the temperature of the exhaust gas, normally at a high temperature of about 250–600° C. can be reduced, and a practical thermoelectric generator which can be made applicable to civil use can be constituted.

In FIG. 7, as the means for cooling the exhaust gas simultaneously with thermal recovery, there is shown a thermoelectric generator constituted to permit heat exchange between the exhaust gas from the thermal input part 3 and the liquid fuel contained in the fuel tank 10. The electric generator of FIG. 7 has a pair of generating units 1 arranged in an opposed state about a thermal input part 3, in which an exhaust gas flow path 18 is set in a manner to surround the fuel tank 10. In the present embodiment, the fuel warmed in the fuel tank 10 is further warmed by the heat discharged from the side surface of the thermal input part 3 in the flow path 19 set to run along the side surface of the thermal input part 3 and evaporated, and sent to the nozzle 11.

In the constitution of the device as shown in FIG. 7, the heat exchange between the liquid fuel in the fuel tank 10 and the exhaust gas from the thermal input part 3 accelerates evaporation of fuel to make it possible to constitute a more efficient, practical, and compact thermoelectric generator.

Figure 8:
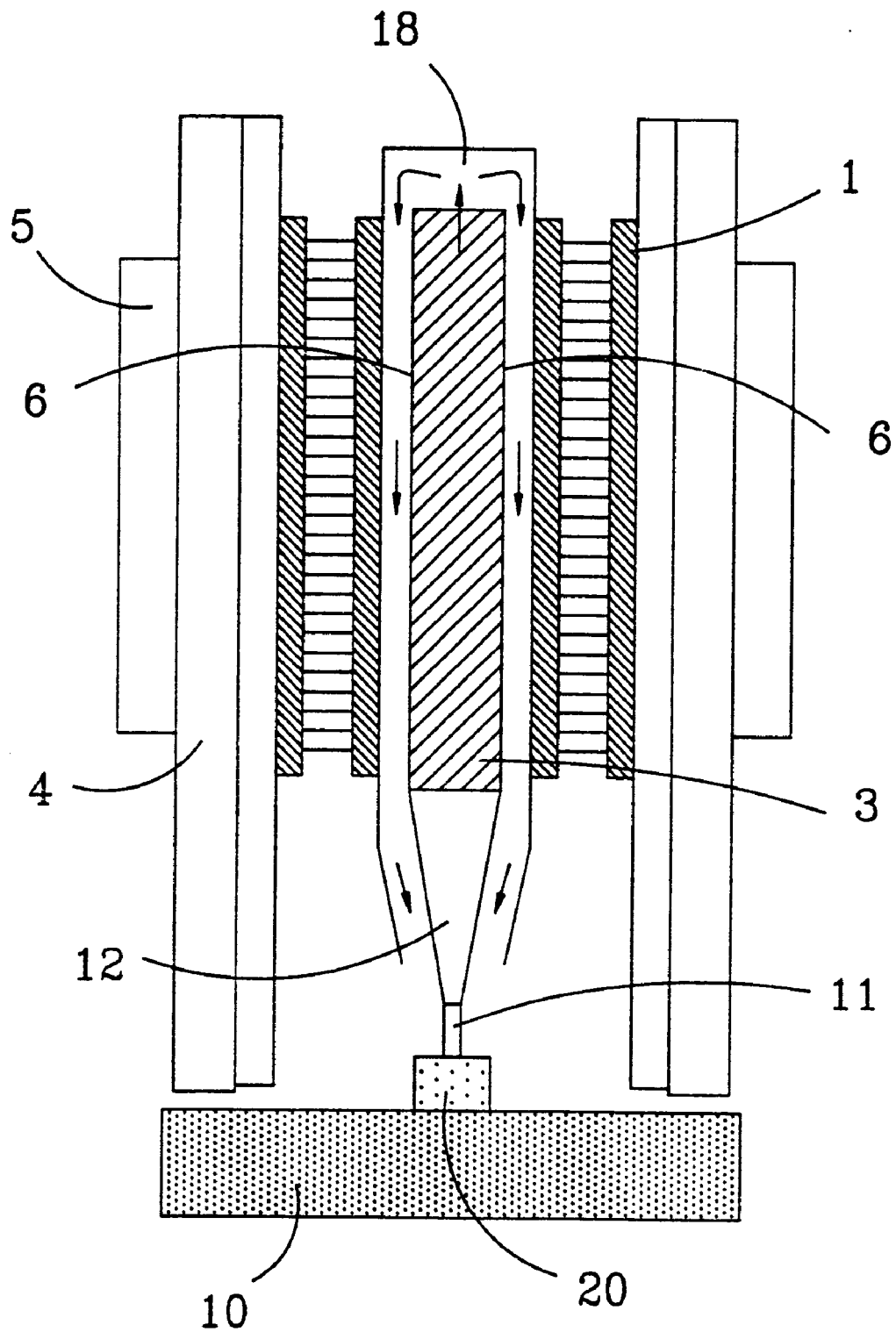
FIG. 8 is a block diagram of a thermoelectric generator according to a variation of the fourth embodiment of the first invention.

In FIG. 8, there is shown a variation of the 4th embodiment wherein, as means for cooling exhaust gas simultaneously with heat recovery, a thermoelectric generator is constituted to permit heat exchange between the exhaust gas from the thermal input part 3 and the fuel gas and air mixed gas which pass through the throat part 12.

The generator of FIG. 8 has a pair of generating units 1 arranged in an opposed state about a thermal input part 3, wherein the exhaust gas flow path 18 is set so that the exhaust gas from the thermal input part 3 passes through the space between the heat conductive end plate 6 on both faces of the thermal input part 3 and the generating unit 1, comes into contact with the surface of the slot part 12, and then is discharged from the generator to the outside.

In the constitution shown in FIG. 8, a compact generator is provided which is furnished with the means for efficiently recovering the exhaust heat while simultaneously reducing the exhaust gas temperature by making heat exchange between the exhaust gas and the heat conductive end plate 6 and mixed gas before combustion.

Figure 9:
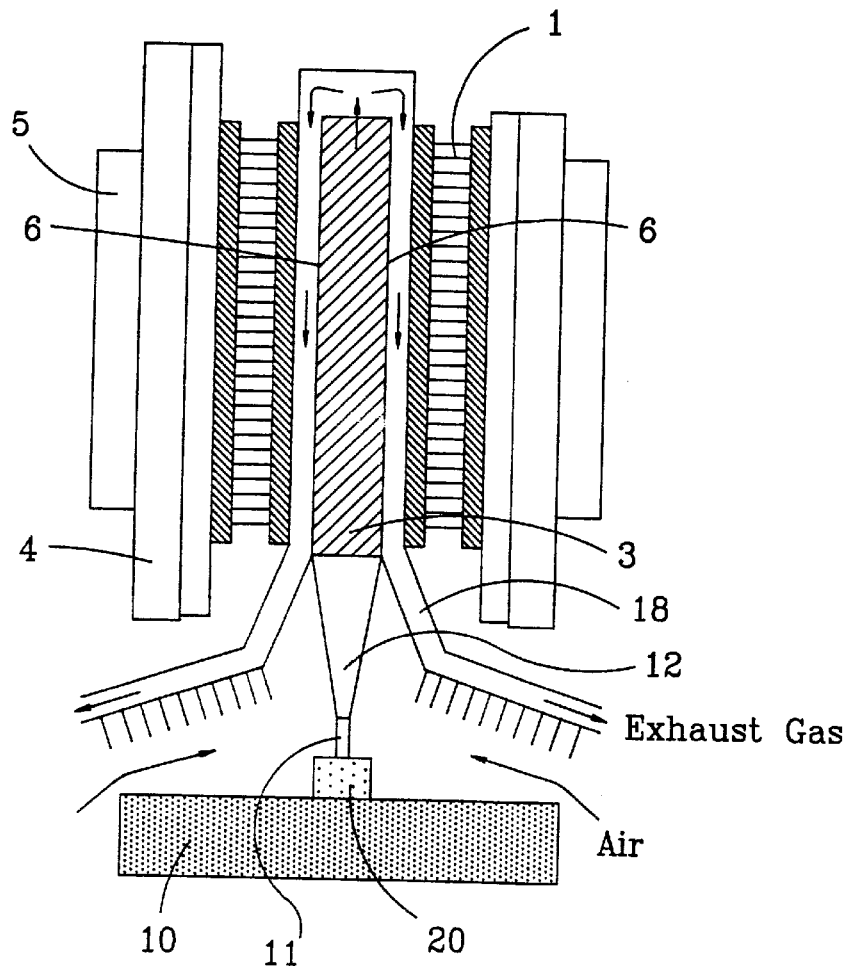
FIG. 9 is a variation of a block diagram of a thermoelectric generator according to the fourth embodiment of the first invention.
Figure 10:
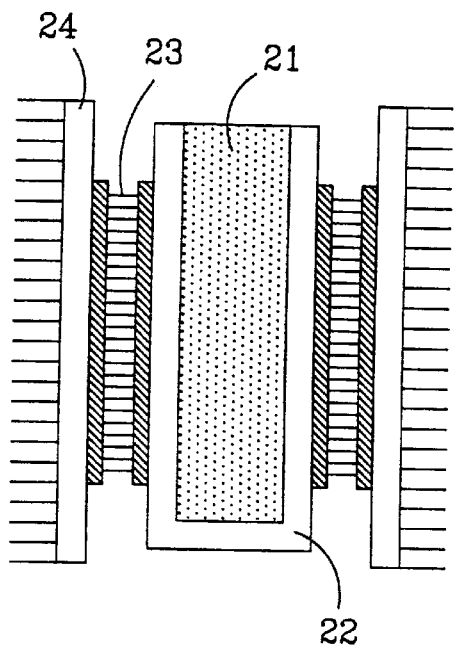
FIG. 10 is a block diagram of conventional thermoelectric generator.

FIG. 9 shows another variation wherein a thermoelectric generator constituted to make heat exchange between the exhaust gas from the thermal input part 3 and the air to be mixed with the fuel gas as the means for cooling the exhaust gas simultaneously with thermal recovery. The electric generator of FIG. 9 has a pair of generating units 1 arranged in opposed state about thermal input part 3, wherein the exhaust gas flow path 18 is set so that the exhaust gas from the thermal input part 3 passes through the space between the heat conductive end plate 6 on both faces of the thermal input part 4 and the generating unit 1, and then is discharged from the generator to the outside. A part of the exhaust gas flow path 18 has fins that are formed on both sides or one side so as to make heat exchange between the high temperature exhaust gas in the flow path and the air in the surrounding of the flow path. The air which has been heat exchanged here is mixed with the fuel gas jetted from the nozzle 11 and sent into the throat part 12.

In the constitution as shown in FIG. 9, a compact generator is provided with such means that, by carrying out heat exchange between the exhaust gas and the heat conductive end plate 6 and pre-combustion air, the exhaust heat can be efficiently recovered, and the exhaust gas temperature can be lowered.

If, in the generator of the constitution as shown in any of FIGS. 1 to 9, an L-shaped throat is used as means for sending a mixed gas into the thermal input part, a more compact generator can be constituted.

As described above, according to the first invention, a compact, highly efficient thermoelectric generator is provided with which the thermal input can be made in higher density in a thermoelectric generator having the catalytic combustion heat as heat source.

Also, it is possible to provide a compact and practical generator which is provided with a means to recover exhaust heat and utilize it for improving the efficiency of the generator and also to reduce the exhaust gas temperature.

(B)

Next, each embodiment of the second invention is explained with reference to FIG. 11 to FIG. 14.

Embodiment 1

Figure 11:
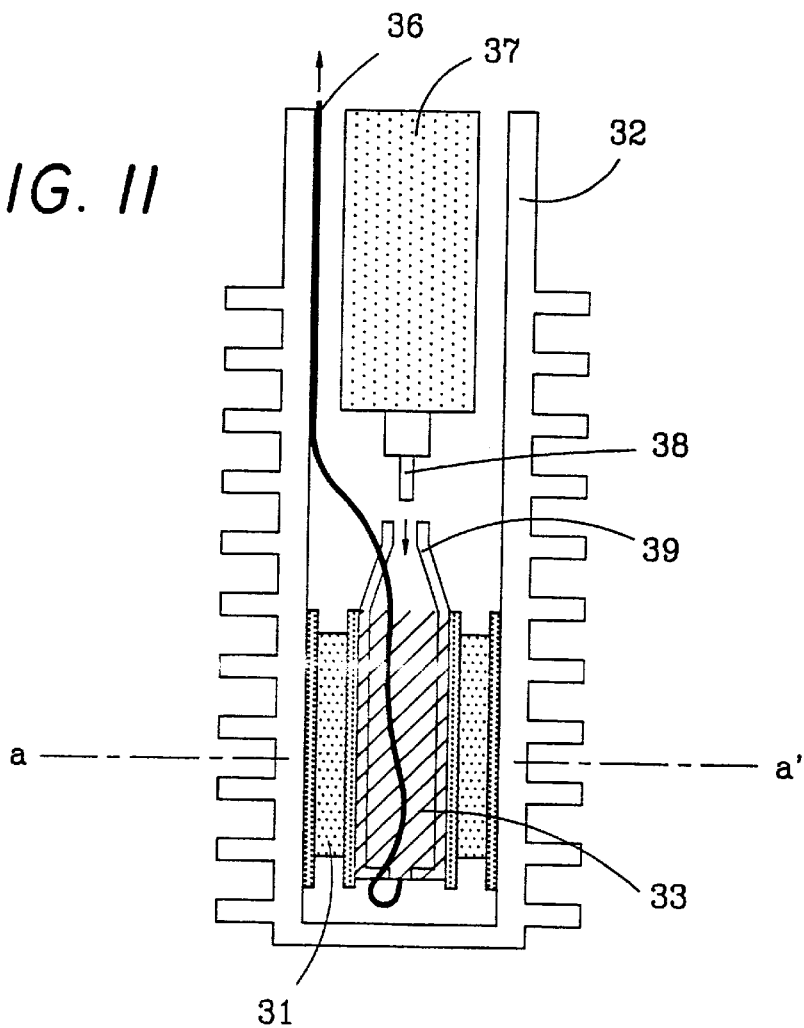
FIG. 11 is a block diagram of a thermoelectric generator according to the first embodiment of the second invention.
Figure 12:
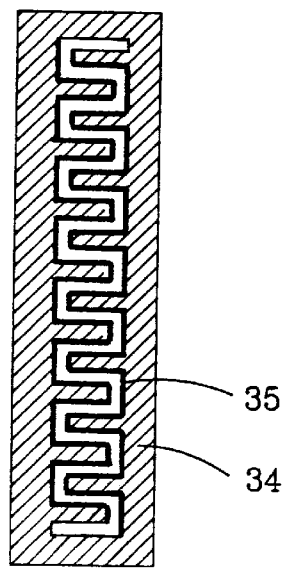
FIG. 12 is a block diagram of a thermal input part according to the first embodiment of the second invention.

FIG. 11 is a sectional view showing the constitution of the thermoelectric generator according to Embodiment 1 of the second invention. FIG. 12 is an enlarged view of the thermal input part 33 thereof. In FIG. 11, the part 31 is a thermoelectric generating unit made by connecting in series a plurality of thermoelectric elements. A pair of thermoelectric generating units are disposed between the radiating part 32 and a central thermal input part 33. The radiating part 32 is constituted by an aluminum rectangular parallelepiped type container having a fin shape on the outside of the four sides. The heat input part 33 is formed, as shown in FIG. 12, by a pair of heat conductive end plates 34 that are opposed to surround a catalytic part 35 formed on the surface of the comb shaped fin side of each heat conductive end plate 34. The heat conductive end plate 34 preferably is made of aluminum die cast which has good processing properties. The catalyst part 35 is installed in a manner to cover the surface of a comb shaped heat exchange fin of the heat conductive end plate 34. The catalyst part 35 is installed in a manner to cover the surface of the heat conductive end plate 34 on the comb shaped heat exchange fin side. For the catalyst part 35, there may be used a heat resistant metal thin plate having a thickness of no more than 0.5 mm made by applying ceramic fine powder such as alumina carrying a precious metal catalyst such as platinum thereto. As a heat resistant metal thin plate, one having good processability such as SUS plate may be used. The part 37 is a fuel tank, for which the commercialized butane gas cylinder for cassette burner is used straightly. The fuel tank 37 is connected to the thermal input part 33 through the nozzle 38 and the throat part 39 which provides a mixing of fuel gas with air. The thermal input part 33 is provided with an exhaust gas pipe 36 which is led to the outside of the container from the top face of the radiation vessel.

With respect to the thermoelectric generator constituted as above, the operation thereof is explained below. The fuel ejected from the nozzle 38 becomes a mixed gas involving the air from the upper face of the radiation part, and passes through the throat part 39 to be sent into the thermal input part 33 from the gas flow inlet. The charged mixed gas undergoes catalytic combustion on the catalyst part 35 in the thermal input part 33, after which it is discharged outside the generator by the exhaust gas pipe 36. The catalytic combustion heat obtained in the thermal input part 33 reaches the high temperature side surface of the thermoelectric unit 31 through the heat conductive end plate 34. As the low temperature side of the thermoelectric element 31 is in contact with the radiation part 32, a temperature difference occurs between the high temperature side and the low temperature side of thermoelectric unit 31 and electric generation is performed by thermoelectric power. A larger electromotive force can be obtained by cooling the outside surface of the radiation part 32 with water rather than by cooling with air. For water cooling, the upper face of the generator may be exposed to air and the generator dipped in water.

When the generator of this embodiment is driven, about 2 minutes' time is necessary before the output is stabilized, but thereafter generation is continued until the fuel gas is exhausted. When the commercialized butane gas for cassette burner is used as a fuel gas, about 8–11 hours of power generation is possible with a cylinder (250 g). With a generator having approximately a 1 liter body, the output was about 20 W (water cooling). Accordingly, a generator having approximately a 2 liter body, the output, with water cooling, was more than 35 W.

According to this embodiment, by using a heat conductive end plate which has a comb shaped structure, a thermal input part of a type integral with the heat exchanger can be constituted, and accordingly, the catalytic combustion heat can be efficiently inputted to the high temperature side surface of the thermoelectric unit. Also, as the heat conductive end plate and the catalyst part are in mutual contact, excessive rise of the surface temperature of the combustion part can be prevented making it possible to realize a constitution suited for the heat resistance of the thermoelectric unit.

Also, as the gas tank is contained in the heat radiation vessel, the fuel supply part can be kept at a high temperature, and it becomes possible to send fuel gas of high temperature and high pressure into the combustion chamber, and efficient combustion can be realized. Furthermore, the constitution is such that the respective parts, such as the thermal input part, the gas tank, and the generating unit, are all contained in the radiation part vessel, the whole generator can be dipped in water, so that a low priced, highly efficient water cooled system can be realized. In the water cooled system, it becomes unnecessary to supply power for driving a radiation fan so as to arouse forced convection, and the electric power obtained by thermoelectric conversion can be wholly used externally.

In the embodiment of FIG. 11, the fuel tank 37 is set at the top part of the thermal input part 33, but the same may be set at the lower part of the thermal input part 33. In such a case, because the exhaust gas is formed at the upper part, the exhaust gas pipe can be short, and piping is easy. Also, it is possible to arrange the fuel tank and the thermal input part in parallel in the radiation vessel.

Though FIG. 11 is an embodiment of the second invention where a pair of generating units are used, when two pairs of generating units are arranged on four faces of the thermal input part, it is needless to say that a generator of higher output can be provided.

Moreover, if a removable cooling water vessel is installed outside the radiation part vessel, convenience is provided in moving the power source.

Alternatively, a fuel tank may be constituted by a heat resistant vessel and a structure to infuse a fuel gas may be adopted.

Embodiment 2

Figure 13:
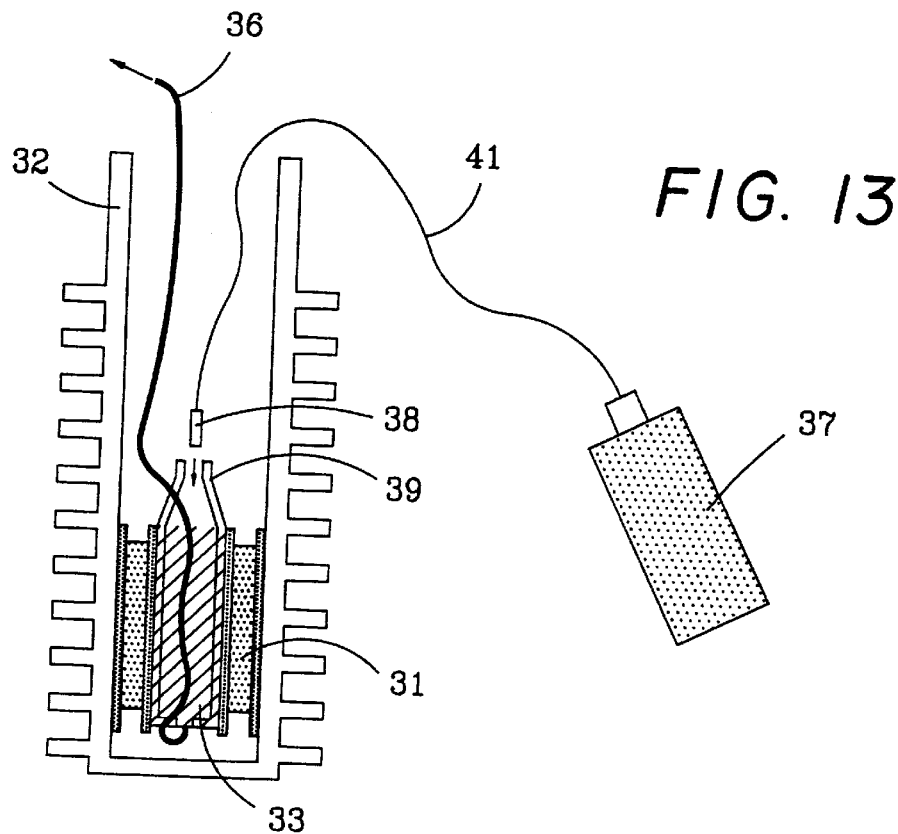
FIG. 13 is a block diagram of a thermoelectric generator according to the second embodiment of the second invention.

FIG. 13 is a sectional view showing the constitution of the thermoelectric generator according to Embodiment 2. In FIG. 13, the part 37 is a fuel tank, for which a commercialized butane gas cylinder for cassette burner is directly used. The fuel tank 37 is connected to the nozzle 38, via a gas tube, and fuel is received in the throat part 39 wherein fuel gas is mixed with air. The fuel tank can be freely placed in or outside the container, within the length of the gas tub 41. Other constitution is the same as in Embodiment 1.

The operation of the thermoelectric generator as constituted above is the same as in Embodiment 1.

According to this embodiment, by using a heat conductive end plate of comb shaped structure, a thermal input part of a type integral with the heat exchanger can be constituted, and accordingly, the catalytic combustion heat can be efficiently inputted to the high temperature side surface of the thermoelectric element. Also, as the heat conductive end plate and the catalyst part are in mutual contact, excessive rise of the surface temperature of the combustion part can be prevented to make it possible to realize a constitution suited for the heat resistance of the thermoelectric element.

Also, due to the constitution in which the fuel tank can be set externally, the fuel tank does not experience a temperature rise, and when it is adapted for use as an audio video power source, convenience and safety in regard to the fuel supply can be achieved.

Furthermore, as a part of the gas tube, the nozzle and the throat part are contained in a head of the radiation vessel, the gas sent to the combustion part can be preheated, and efficient combustion can be realized.

Moreover, due to the constitution of all parts other than the gas tank being contained in the radiation vessel, the whole electric generator can be dipped in water, and thus a cheap and highly efficient water cooling system can be realized. When using a water cooling system, it becomes unnecessary to supply power for a driving radiation fan so as to arouse forced convection, and the electric power obtained by thermoelectric conversion can be wholly used externally.

Also, when a removable cooling water tank is set on the outside of the radiator vessel, it becomes convenient in moving the power source.

Further, the fuel tank may be constituted by a heat resistant container, so as to permit infusion of fuel gas.

Embodiment 3

Figure 14:
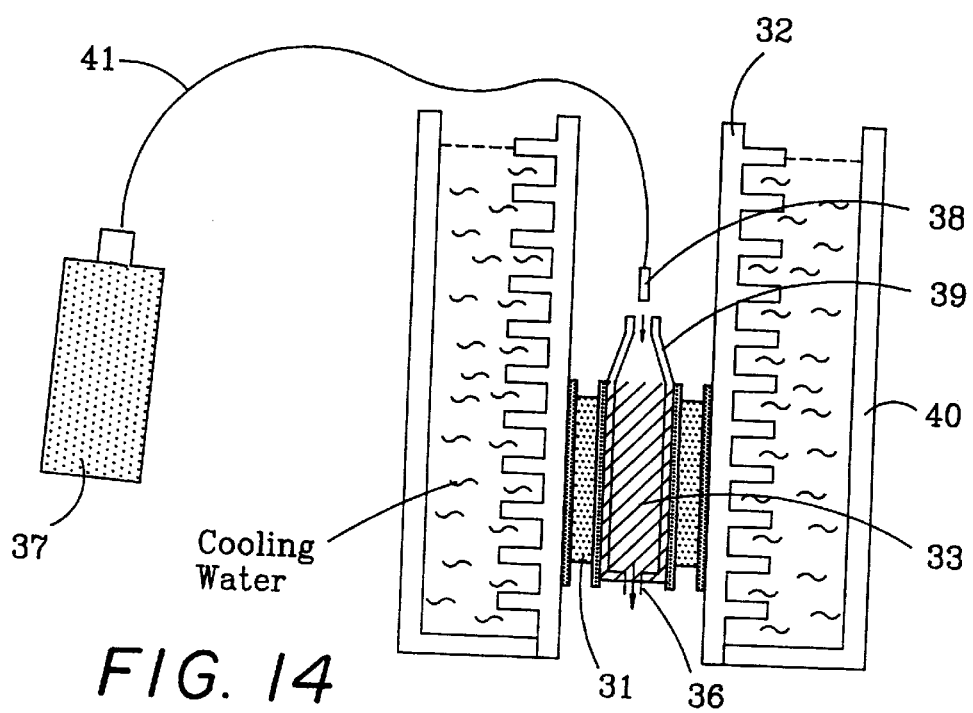
FIG. 14 is a block diagram of a thermoelectric generator according to the third embodiment of the second invention.

In FIG. 14, Embodiment 3 of the second invention is shown. There is shown a constitution of a thermoelectric generator having a construction wherein a generation units 31 comprising thermoelectric elements are joined to both sides of the thermal input part 33, and held by a pair of heat radiation parts 32 comprising heat conductive plates. The outer surface of the heat conductive plate of the radiator 32 has a fin shape so as to increase of the heat exchange area. On the outer surface of this radiator, there is installed a pair of removable cooling water tanks 40, thereby making it possible to carry out either air cooling or water cooling. Also, in order to make it possible to install the fuel tank 37 on the body or to use it separated from the body, the nozzle part 38 and the fuel tank 37 are connected by a tube 41. Other structures are same as in Embodiment 1.

The operation of the generator of this constitution is the same as in Embodiment 1.

According to the constitution of this third embodiment, by using a heat conductive end plate having a comb shaped structure, a thermal input part of a type integral with the heat exchanger can be constituted, and accordingly, the catalytic combustion heat can be efficiently inputted to the high temperature side surface of the thermoelectric element. Also, as the heat conductive end plate and the catalyst part are in mutual contact, excessive rise of the surface temperature of the combustion part can be prevented to make it possible to realize a constitution suited for the heat resistance of the thermoelectric element.

Also, due to the constitution in which the fuel tank can be set externally, the fuel tank does not show temperature rise, and when it is adapted for use as an audio video power source which requires a continuous supply of fuel, convenience and safety in regard to the fuel supply can be achieved. Also, in FIG. 14, because the nozzle part or a mixing part of fuel gas with air is warmed by the exhaust heat from the thermal input part, highly efficient combustion can be carried out. Efficient combustion can be realized.

As apparent from the above description, according to the second invention, thermal input of catalytic combustion heat to the thermoelectric element can be made in higher density, and highly efficient and cheap radiation from a water cooling system can be realized without the driving power of a radiation fan. Thus, a compact and practical constitution of thermoelectric generator for outdoor use is provided.

(C)

Next, the embodiments of the third invention will be explained with reference to FIG. 15 and FIG. 16.

Embodiment 1

Figures 15A, 15B:
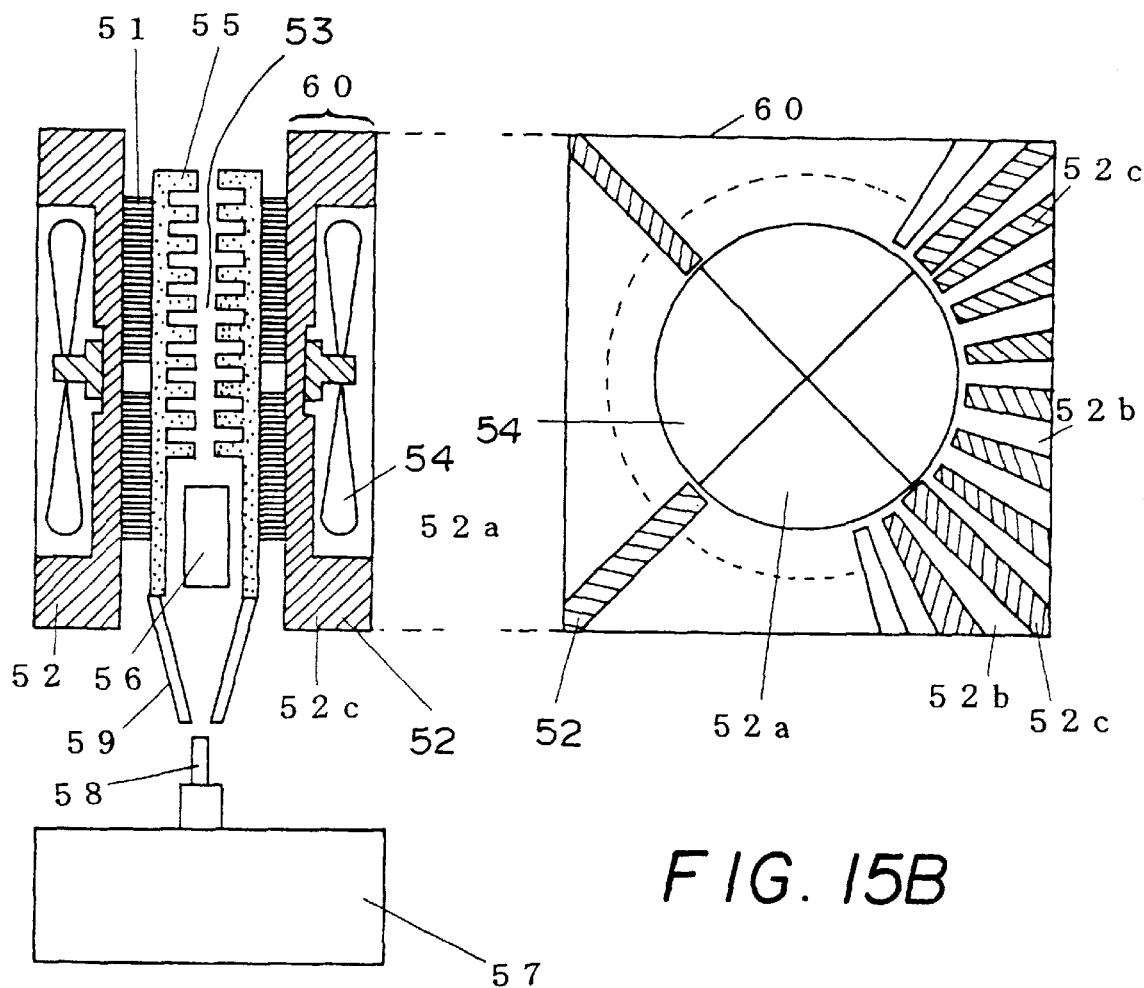
FIG. 15 (A) and (B) are a block diagram of a thermoelectric generator according to the first embodiment of the third invention.

FIG. 15(a) is a vertical sectional view of the thermoelectric generator of Embodiment 1 of the third invention, and FIG. 15(b) is a front view of the radiation part 60 of said thermoelectric generator. In FIG. 15(a), the part 51 is a generation unit made by connecting a plurality of thermoelectric elements in series. A generation unit 51 is disposed between the fin part 52 and the thermal input part 53 on both sides of the thermal input part 53. The fin part 52 is an aluminum single plate having a large number of fins 52c on the outer surface of the disc shaped base plate. As shown in FIG. 15(b), at the central part 52a of the fin 52, the fin 52c is positioned low or does not exist, where a DC axial flow fan 54 is installed. The fin 52c is radially formed so that the compulsory air flow of the fan 54 is radially outward from the center of the fan 54. The part 52b is a gap between them. The thermal input part 53 comprises a heat conductive combustion chamber 55 of aluminum material and a combustion part 56 installed inside the combustion chamber 55. It is desirable for the combustion chamber 55 to have a fin structure on the inner wall. The part 57 is a fuel tank, and is connected to the combustion chamber 55 through the nozzle 58 and the throat part 59.

With respect to the thermoelectric generator constituted as above, the operation thereof is explained as follows.

In FIGS. 15(a) & (b), a commercialized butane gas is used as a fuel. The fuel gas ejected from the nozzle 58 becomes a mixed gas involving air, it then is passed through the throat part 59, and burns in the combustion chamber 55. The produced exhaust gas is discharged outside the generator from the exhaust port on the upper part of the combustion chamber 55. The combustion heat obtained in the thermal input part 53 is supplied to the high temperature side surface of the thermoelectric element of the generation unit 51, and as the low temperature side of the thermoelectric element is in contact with the fin part 52, a temperature difference is formed between the high temperature side and the low temperature side of the thermoelectric element, and electric generation by thermoelectric power takes place. When the generation output reaches a size necessary for driving the fan 54, the fan 54 starts to rotate, the temperature difference formed on the thermoelectric element and the accompanied thermoelectric power increase, and in the meantime the power reaches the normal state.

When the electric generator of this embodiment is driven, it requires about 30 seconds until the two fans (DC 12V, 100 mA) begin to start, and about 5–8 minutes until the output (15 W) stabilizes. The surface temperature of the element at the time of the stabilization of output was 210° C. on the high temperature side and 90° C. on the low temperature side.

According to the present embodiment, because a radiation part 60 having a heat exchange fin part 52 and a fan part 54 formed in one-piece can be constituted, the volume of the radiation part 60 can be drastically constrained. Also, due to the constitution of leading the forced air radially from the central part of the fan 54 in the gap of the fin 52c, resistance by the fin 52 is decreased, and the air volume of fan can be increased. As a result, it has become possible to utilize the fan capacity to the maximum extent, leading to an improvement in the performance of the radiation part 60. Simultaneously, the outlet temperature of the heat exchanged air can be suppressed to a low temperature, and safety can be secured.

In FIGS. 15(a) and (b), there is adopted a constitution wherein a gas tank is installed at the bottom part of the generator, and the fuel gas is preheated with the heat from the fin part. However, in order to facilitate tank replacement or the like, the tank may be externally set. In such a case, it is desirable to constitute the generator such that the fuel gas can be preheated with the combustion heat or the exhaust air heat before it is sent into the nozzle.

In the above-described embodiment, a butane gas is used as a fuel, but it is of course possible to use propane gas, natural gas, etc. In the case where a liquid fuel, such as alcohols, is used, the handling of the generator may become inconvenient, but it becomes unnecessary to use the nozzle or the throat, so that a more simple constitution can be realized.

If, as a heat source in the thermal input part, catalytic combustion heat is utilized, planar uniform thermal input can be made, so that a generator having higher efficiency can be constituted. Alternatively, there may be constituted a generator as means for recovering a part of the waste heat by utilizing the waste heat of fuel battery or engine.

Embodiment 2

Figure 16A:
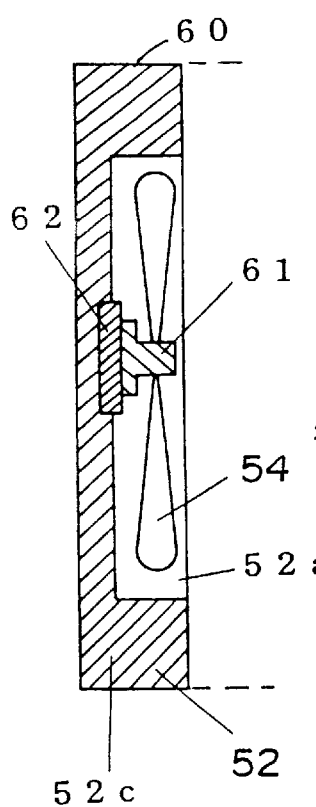
FIG. 16 (A) and (B) are a block diagram of a thermoelectric generator according to the second embodiment of the third invention.
Figure 16B:
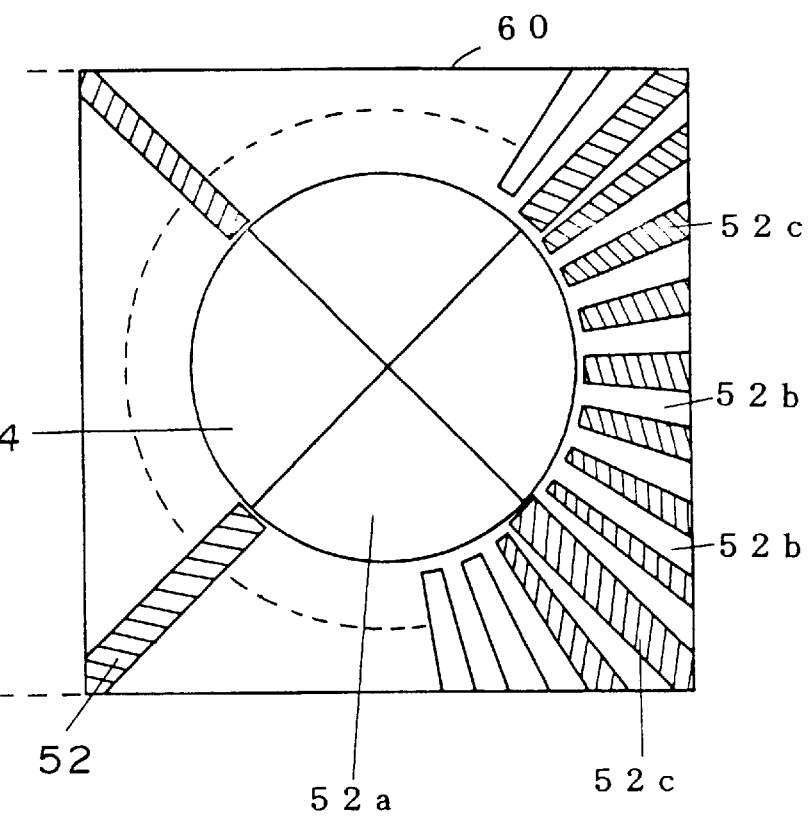

FIG. 16(a) is a vertical sectional side view showing the constitution of the heat radiation part 60 of the thermoelectric generator according to Embodiment 2 of the third invention, and FIG. 16(b) is a front view of the heat radiation part 60. In FIG. 16, the part 52 is an aluminum fin part, and 54 is a DC axial flow fan.

The part 61 is a motor part of the fan. The motor part 61 is buried in the fin 52 through the heat insulation layer 62. For the heat insulation layer 62, a ceramic material such as alumina wool can be used. A heat insulation layer may be provided by an air layer of about several millimeters.

The operation of the thermoelectric generator having the above constitution of the heat radiation part is the same as that of Embodiment 1, excepting the following points.

By providing a heat insulating layer 62 between the motor part 61 and the fin part 52, in the case of this embodiment, even when the temperature of the central part of the fin is 100° C., the motor part can be kept to 70° C. or lower, so that the durability of the fan 54 can be improved.

Besides, even if the size and shape of the generator change, the present invention can be applied by making the thicknesses of the peripheral part and central part of the fin bottom plate or the thickness of the heat insulation layer optimum.

As described above, according to the third invention, a thermoelectric generator utilizing as a heat source combustion heat or waste heat including catalytic combustion heat having a compact constitution of a highly efficient and a durable heat radiation part, and accordingly, it is possible to realize a reduction in size and weight or elevation of performance of the thermoelectric generator.

What is claimed is:

1. A thermoelectric generator, comprising:
   a thermal input part being defined in part by a heat conductive end plate, said heat conductive end plate having an inner surface and an outer surface and said inner surface includes convex and concave configurations;
   a heat radiation part;
   a generation unit including a plurality of operatively arranged thermoelectric elements, said generation unit being disposed between said thermal input part and said heat radiation part and in contact with at least a portion of said heat radiation part and with at least a portion of said outer surface of said heat conductive end plate of said thermal input part;
   supplying and mixing means for supplying a fuel and for supplying air and for mixing said fuel with air to form a fuel and air mixture and for supplying said fuel and air mixture to said thermal input part; and
   a catalyst part provided on at least some of said convex and concave configurations of said inner surface of said heat conductive end plate.

2. The thermoelectric generator defined in claim 1, wherein:
   said catalyst part includes a catalyst material coated on a heat resistant metal thin plate, said catalyst material including at least a ceramic fine powder and a precious metal material, and said metal thin plate has a thickness of 0.5 mm or less and covers at least a part of said convex and concave configurations of said inner surface of said heat conductive end plate.

3. The thermoelectric generator defined in claim 1, wherein:
said thermal input part includes a fuel inflow side and an exhaust gas discharge side, and
a lesser amount of said catalyst part is provided on said convex and concave configurations of said heat conductive end plate at said fuel inflow side than at said exhaust gas discharge side.

4. The thermoelectric generator defined in claim 1, wherein:
said thermal input part includes a fuel inflow side and an exhaust gas discharge side, and
a thickness of said heat conductive end plate varies in the direction of fuel gas flow and said heat conductive end plate is thicker at said fuel inflow side than at said exhaust gas discharge side.

5. A thermoelectric generator, comprising:
a thermal input part being defined in part by two heat conductive end plates, each heat conductive end plate having an inner surface and an outer surface and each of said inner surfaces includes convex and concave configurations;
at least one heat radiation part;
a pair of generation units each including a plurality of operatively arranged thermoelectric elements, each generation unit being disposed between said thermal input part and a portion of a heat radiation part such that said thermal input part is operatively shared by said generation units, each generation unit contacting at least a portion of said outer surface of one of said heat conductive end plates and contacting at least a part of said portion of said heat radiation part;
supplying and mixing means for supplying a fuel and for supplying air and for mixing said fuel with air to form a fuel and air mixture and for supplying said fuel and air mixture to said thermal input part; and
a catalyst part provided on at least some of said convex and concave configurations of said inner surfaces of said heat conductive end plates.

6. The thermoelectric generator defined in claim 5, wherein:
said catalyst part includes a catalyst material coated on a heat resistant metal thin plate, said catalyst material including at least a ceramic fine powder and a precious metal material, and
said metal thin plate has a thickness of 0.5 mm or less and covers at least a part of said convex and concave configurations of said inner surfaces of said heat conductive end plates.

7. The thermoelectric generator defined in claim 5, wherein:
said thermal input part includes a fuel inflow side and an exhaust gas discharge side, and
a lesser amount of said catalyst part is provided on said convex and concave configurations of said heat conductive end plates at said fuel inflow side than at said exhaust gas discharge side.

8. The thermoelectric generator defined in claim 5, wherein:
said thermal input part includes a fuel inflow side and an exhaust gas discharge side, and
thicknesses of said conductive end plates vary in the direction of fuel gas flow and said conductive end plates are thicker at said fuel inflow port side than at said exhaust gas discharge side.

9. A thermoelectric generator, comprising:
a thermal input part using a catalyst part as a portion of a catalytic combustion heat source;
a heat radiation part having a heat conductive container, said thermal input part being at least partially disposed in said heat conductive container, at least a part of an outer surface of said heat conductive container having a fin shape;
at least a pair of generation units disposed between said thermal input part and said heat radiation part, said generation units including a plurality of operatively arranged thermoelectric elements;
mixing means for mixing a fuel with air to form an air and fuel mixture;
fuel supplying means for supplying fuel to said mixing means and for supplying said air and fuel mixture to said thermal input part, said fuel supplying means including a fuel tank and said fuel supplying means and said mixing means being installed in said heat conductive container; and
cooling means for cooling said heat radiation part,
wherein said air and fuel mixture is burned at said catalyst part to heat said thermal input part while simultaneously said cooling means cools said heat radiation part, and
said thermal input part includes a pair of oppositely disposed heat conductive end plates each having formed on an inside wall thereof, respectively, comb-shaped heat exchange fins, said catalyst part is provided on at least a portion of said comb-shaped heat exchange fins.

10. The thermoelectric generator defined in claim 9, wherein:
said cooling means includes a cooling water container removably connected with and at least partially surrounding said heat radiation part.

11. A thermoelectric generator, comprising:
a thermal input part using a catalyst part as a portion of a catalytic combustion heat source;
a heat radiation part having a heat conductive container, said thermal input part being at least partially disposed in said heat conductive container, at least a part of an outer surface of said heat conductive container having a fin shape;
at least a pair of generation units disposed between said thermal input part and said heat radiation part, said generation units including a plurality of operatively arranged thermoelectric elements;
mixing and supplying means for mixing a fuel with air to form an air and fuel mixture and for supplying said air and fuel mixture to said thermal input part, said mixing means being located in said heat conductive container of said heat radiation part;
a fuel tank, said fuel tank being removably received in said heat conductive container of said heat radiation part;
means for transporting fuel from said fuel tank to said mixing and supplying means while said fuel tank is disposed in or disposed out of said heat conductive container; and cooling means for cooling said heat radiation part, wherein said air and fuel mixture is burned at said catalyst part to heat said thermal input part while simultaneously said cooling means cools said heat radiation part, and said thermal input part includes a pair of oppositely disposed heat conductive end plates each having formed on an inside wall thereof, respectively, comb-shaped heat exchange fins, said catalyst part is provided on at least a portion of said comb-shaped heat exchange fins.

12. The thermoelectric generator defined in claim 11, wherein:

said cooling means includes a cooling water container removably connected with and at least partially surrounding said heat radiation part.

13. A thermoelectric generator, comprising:

a thermal input part;

a heat radiation part having a fin part, said fin part defining a fan opening;

a fan mounted in said fan opening such that said fan is at least partially embedded in said fin part, said fan air cooling said heat radiation part;

a generation unit disposed between said thermal input part and said heat radiation part, said generation unit including a plurality of operatively arranged thermoelectric elements;

fuel supplying means for supplying fuel to said thermal input part for heating said thermal input part, wherein said fan is at least partially disposed below an outer edge of a fin located in an area of said fin part other than said fan opening.

14. The thermoelectric generator defined in claim 13, wherein:

fins of said fin part are formed in a radial disposition, and said fan opening is located at a central part of said radial disposition.

15. The thermoelectric generator defined in claim 13, wherein:

said fan opening of said fin part is defined by fins having a height less than fins disposed outside said fan opening.

16. The thermoelectric generator defined in claim 13, wherein:

said fin part has a vacancy of fins at said fan opening.

17. The thermoelectric generator defined in claim 13, further comprising:

heat insulating means for insulating a motor portion of said fan from said fin part to which said fan is mounted, wherein said fan is an axial flow fan.

* * * * *